US012638487B2

(12) United States Patent (10) Patent No.: US 12,638,487 B2
Olejiniczak (45) Date of Patent: May 26, 2026

(54) CIRCUIT FOR IMPEDANCE MEASUREMENTS

(71) Applicant: Mettler-Toledo GmbH, Greifensee (CH)

(72) Inventor: Stefan Olejiniczak, Stansstad (CH)

(73) Assignee: Mettler-Toledo GmbH, Greifensee (CH)

( * ) Notice: Subject to any disclaimer, the term of this patent is extended or adjusted under 35 U.S.C. 154(b) by 197 days.

(21) Appl. No.: 18/704,842

(22) PCT Filed: Nov. 2, 2022

(86) PCT No.: PCT/EP2022/080543
§ 371 (c)(1),
(2) Date: Apr. 25, 2024

(87) PCT Pub. No.: WO2023/078923
PCT Pub. Date: May 11, 2023

(65) Prior Publication Data
US 2024/0418757 A1 Dec. 19, 2024

(30) Foreign Application Priority Data
Nov. 4, 2021 (EP) ..................................... 21206525

(51) Int. Cl.
*G01R 27/16* (2006.01)
*G01R 1/20* (2006.01)
(Continued)

(52) U.S. Cl.
CPC ............. *G01R 27/16* (2013.01); *G01R 1/203* (2013.01); *G01R 1/206* (2013.01); *G01R 1/30* (2013.01);
(Continued)

(58) Field of Classification Search
CPC ......... G01R 27/14; G01R 27/16; G01R 1/203
See application file for complete search history.

(56) References Cited

U.S. PATENT DOCUMENTS 7,135,881 B2 11/2006 Walker et al.
7,397,235 B2 7/2008 Harjung
7,538,539 B1 * 5/2009 Balke ...................... G01R 15/08
324/123 R

FOREIGN PATENT DOCUMENTS

DE 19729464 C1 10/1998

OTHER PUBLICATIONS

Hartov, A. et al., A Multichannel Continuously Selectable Multifrequency Electrical Impedance Spectroscopy Measurement System, IEEE Transactions on Biomedical Engineering, Jan. 2000, pp. 49-58, vol. 47, No. 1.

(Continued)

*Primary Examiner* — Farhana A Hoque
(74) *Attorney, Agent, or Firm* — Standley Law Group LLP; Jeffrey S. Standley; Adam J. Smith

(57) ABSTRACT

The front-end circuit for an impedance measurement comprises an excitation-terminal, intended to receive an excitation signal relative to a common ground, a first and a second input-terminal, intended to be connected to two electrodes, a first and a second output-terminal, whereby each one of the two output-terminals is intended to provide a measurement signal during a use of the front-end circuit in a measurement, preferably to an analogue to digital converter device; a first and a second mode selection-switch-unit, each with two mode switch-inputs, an operational amplifier and a reference resistor. During a measurement and depending on the state of the mode selection-switch-units, a feedback-loop of the operational amplifier comprises either a sample arranged between the two input-terminals or the reference resistor.

17 Claims, 2 Drawing Sheets

(51) Int. Cl.

| | |
|---|---|
| *G01R 1/30* | (2006.01) |
| *G01R 15/00* | (2006.01) |
| *G01R 19/25* | (2006.01) |
| *G01R 27/08* | (2006.01) |

(52) U.S. Cl.
CPC ....... *G01R 15/002* (2013.01); *G01R 19/2509* (2013.01); *G01R 27/08* (2013.01)

(56) References Cited

OTHER PUBLICATIONS

Valente, V. et al., Wideband Fully-Programmable Dual-Mode CMOS Analogue Front-End for Electrical Impedance Spectroscopy, Sensors, Jul. 25, 2016, 20 pages, vol. 16, issue 8, 1159, https:doi.org/10.3390/s16081159.

* cited by examiner

CIRCUIT FOR IMPEDANCE MEASUREMENTS

TECHNICAL FIELD

The invention relates to a front-end circuit for an impedance measurement, which can be used for two different measurement modes: a voltage source and a current source mode. Further, the invention relates to a measurement circuit comprising the front-end circuit, an impedance sensor comprising the circuit, the use of the circuit and the impedance sensor as well as for instruments comprising the impedance sensor.

BACKGROUND ART

There are two basic modes to measure an impedance of a sample which is placed between two electrodes:

In a voltage source- or V-source mode, a voltage is applied and the resulting current flowing through the sample is measured.

In a current source- or I-source mode, a current is provided and the voltage across the sample is measured.

Many known measurement devices are using one of the two modes.

An application of impedance measurements are titrations. "Controlled current potentiometric titration" implies an impedance measurement in the I-source mode. "Controlled voltage amperometric titration" implies an impedance measurement in the V-source mode.

The article "Wideband Fully-Programmable Dual-Mode CMOS Analogue Front-End for Electrical Impedance Spectroscopy" by V. Valente, A. Demosthenous (Sensors 2016, 16(8), 1159; https://doi.org/10.3390/s16081159) describes the advantages of using both measurement modes. The article suggest integrating the readout units for both measurement modes on a single integrated analogue front-end simply by placing them side by side on the same circuit board. A size reduction of the circuit board is therefore limited by the components needed for both readout units.

It is therefore the object of the invention to provide a front-end circuit for impedance measurements of the V- and the I-source mode, which allows a reduction of size, a reduced power consumption and lower production costs.

SUMMARY OF INVENTION

This is archived by the features of the independent claims. A front-end circuit comprises an excitation-terminal, a first and a second input-terminal, an operational amplifier and a switching unit.

The operational amplifier comprises an inverting input and an Op-Amp output.

The excitation-terminal is intended to receive an excitation signal relative to a common ground. The first and the second input-terminal are intended to be connected to two electrodes. The state of the switching unit determines an operation of the operational amplifier.

In the case of the use of the front-end circuit, the electrodes are connected to the first and the second input terminal and a sample is arranged between the electrodes. During use an excitation signal is received at the excitation-terminal. The excitation signal controls, depending on the state of the switching unit, either a current flowing through the electrodes and the sample or a voltage across the electrodes and the sample.

Typically, the operational amplifier is operated as closed-loop amplifier, whereby a feedback-loop is formed between the inverting input and the Op-Amp output. In such an operation, the state of the switching unit can control if the electrodes and the sample are part of the feedback-loop or if they are arranged outside of the feedback-loop. If the electrodes and the sample are part of the feedback-loop, the current flowing through them can be controlled by the excitation signal. If the electrodes and the sample are outside of the feedback-loop, the voltage across them can be controlled by the excitation signal. Preferably, a reference resistor is arranged in the feedback-loop which does not include the electrodes and the sample.

Consequently, the front-end circuit acts as voltage or as current source depending on the state of the switching unit. The front-end circuit can be used to measure the impedance of a sample.

A front-end circuit for an impedance measurement comprises further a first and a second output-terminal.

In the case of the use of the front-end circuit in a measurement the electrodes are connected to the first and the second input terminal and a sample is arranged between the electrodes. During use an excitation signal is received at the excitation-terminal. During use, the first output-terminal provides a measurement signal indicating the voltage across the sample and the second output-terminal provides a measurement signal indicating the current flowing through the sample.

Typically, the first and the second output-terminals are arranged in such a way that there is, during use, always only one of them connected to a point inside the feedback-loop if the operational amplifier is operated as closed-loop amplifier and if the switching unit controls if the electrodes and the sample are part of the feedback-loop or not.

In a preferred embodiment, the front-end circuit for an impedance measurement comprises an excitation-terminal, two input-terminals, two output-terminals, two mode selection-switch-units, an operational amplifier and a reference resistor.

The excitation-terminal is intended to receive an excitation signal relative to a common ground.

The two input-terminals are intended to be connected to two electrodes.

Each one of the two output-terminals is intended to provide a measurement signal during a use of the front-end circuit in a measurement. Preferably, every one of the two output-terminals is intended to provide the respective measurement signal to an analogue to digital converter device.

Each of the two mode selection-switch-units comprises a first mode switch-input, a second mode switch-input and a switch-output. Depending on the state of the mode selection-switch-unit, either the first mode switch-input or the second mode switch-input is connected to the switch-output. The switching unit comprises the two mode selection-switch-units.

The operational amplifier comprises a non-inverting input, an inverting input and an Op Amp-output. The non-inverting input of the operational amplifier is connected to the common ground.

The reference resistor comprises a first and a second resistor terminal.

The Op-Amp output is connected to the first mode switch-input of the first mode selection-switch-unit and the second mode switch-input of the second mode selection-switch-unit.

The excitation-terminal is connected to the second mode switch-input of the first mode selection-switch-unit and the first mode switch-input of the second mode selection-switch-unit.

The switch-output of the first mode selection-switch-unit is connected to the first input-terminal and the first output-terminal.

The switch-output of the second mode selection-switch-unit is connected to the first resistor terminal of the reference resistor, and the second output-terminal.

The second resistor terminal of the reference resistor is connected to the inverting input of the operational amplifier and the second input-terminal.

The front-end circuit of claim 1 allows to use multiple elements of the front-end circuit in both measurement modes: Both modes can use the same operational amplifier, the same output-terminals and the same input-terminals. Further, the excitation signal delivered to the excitation-terminal can be the same, which allows to use the same excitation signal generator. Especially the use of a single operational amplifier for both modes reduces the production costs and the power consumption.

This reduction of the parts is possible because the mode selection-switch-units determine the feedback-loop of the operational amplifier and the connection of the excitation-terminal.

Preferably, the state of both mode selection-switch-units is selectable with an electrical control signal. Preferably, both mode selection-switch-units are switched synchronously.

Preferably, the mode selection-switch-units are two single-pole double-throw analogue switches, whereby each of the switches forms one of the mode selection-switch-units.

In another preferred embodiment, the two mode selection-switch-units are combined in a double-pole double-throw analogue switch, whereby each of the channels forms one of the mode selection-switch-units. Preferably, both channels of the double-pole double-throw analogue switch are correlated, such that the state of both channels is selectable by a single control signal. In this case, the synchronous switching of the both mode selection-switch-units is a property of the switch.

In further embodiments, the two mode selection-switch-units are part of a multiple-pole double-throw analogue switch.

The impedance of an electrical element is the ratio of the complex representation of the sinusoidal voltage across its terminals and the complex representation of the current flowing through it. The impedance can be described by a magnitude and a phase shift or by a resistance and a reactance. In the sense of the invention, an impedance sensor can produce data from which at least one, preferably two parameters, which describe the impedance, can be derived. In the sense of the invention, deriving at least one parameter describing the impedance from measurement signals is preferably considered to be a measurement of the impedance.

A node in the sense of the invention is a conducting connection of at least two conductors and therefore a region where at least three electrical elements are in conducting connection with each other.

In an embodiment, the front-end circuit is used in the I-source mode, preferably to measure an impedance of a sample. Thereby, the state of the switching unit is such that an excitation signal controls the current flowing through the electrodes and the sample. Preferably, the state of the first mode selection-switch-unit is chosen such that its switch-output is connected to its first mode switch-input and the state of the second mode selection-switch-unit is chosen such that its switch-output is connected to its first mode switch-input. A first and a second electrode are connected to the first respectively the second input-terminal. The sample connects the first and the second electrode. An excitation signal is applied to the excitation-terminal.

In a preferred embodiment, the first input-terminal is connected to the switch-output of the first mode selection-switch-unit and to the first output-terminal. The switch-output of the first mode selection-switch-unit is connected to the Op-Amp output in the case at hand. The excitation-terminal is connected to the switch-output of the second mode selection-switch-unit.

In this case, the excitation signal applied to the excitation-terminal determines the voltage at the second mode selection-switch-unit, the second output-terminal and the first resistor terminal of the reference resistor.

During a measurement, there is a feedback-loop formed between the output and the inverting input of the operational amplifier in the I-source mode. This feedback-loop comprises the first mode selection-switch-unit, the first and the second electrode and the sample to be measured. Assuming idealized components, the measurement principle can be explained as follows:

It is the property of an ideal operational amplifier with such a feedback-loop to generate a current at its output, which ensures that the voltage at its inverting input equals the voltage at its non-inverting input. If this voltage at the non-inverting input is the common ground, this inverting input forms a virtual ground. Furthermore, no current flows into any one of the inputs of such an operational amplifier.

Therefore, the operational amplifier ensures in this situation, if necessary by generating the required current, that the voltage at the second resistor terminal of the reference resistor, the second input-terminal and the inverting input of the operational amplifier equals the common ground.

In this situation, the current at the output of the operational amplifier equals the current through the reference resistor and the current through the sample. The operational amplifier acts as a constant current source for the sample in this configuration.

The second electrode is at the same potential as the second input-terminal, which is the common ground. The voltage at the first output-terminal is the same as the voltage at the first electrode. Consequently, in this situation, the voltage at the first output-terminal relative to the common ground equals the voltage across the sample.

The current caused by the excitation signal flows through the reference resistor as explained above. The second resistor terminal of the reference resistor is connected to the inverting input of the operational amplifier and therefore is at common ground potential. Consequently, in this situation, the voltage at the second output-terminal relative to the common ground equals the voltage across the reference resistor. As the reference resistor is assumed to obey Ohm's law, the voltage across the reference resistor is proportional to the current caused by the excitation signal, which is also the current flowing through the sample.

Consequently, the voltage at the first output-terminal is a measure for the voltage across the sample and the voltage at the second output-terminal is a measure for the current through the sample. The impedance of the sample can be determined using the two measurements signals obtainable at the first and the second output-terminal. Preferably, the impedance of the sample is determined by dividing the voltages at the first and the second output-terminal.

In an embodiment, the front-end circuit is used in the V-source mode, preferably to measure an impedance of a sample. Thereby, the state of the switching unit is such that an excitation signal controls the voltage across the electrodes and the sample. Preferably, the state of the first mode selection-switch-unit is chosen such that its switch-output is connected to its second mode switch-input and the state of the second mode selection switch-unit is chosen such that its switch-output is connected to its second mode switch-input. A first and a second electrode are connected to the first respectively the second input-terminal. A sample to be measured connects the first and the second electrode. An excitation signal is applied to the excitation-terminal.

In a preferred embodiment, the excitation signal causes the switch-output and the second mode switch-input of the first mode selection-switch-unit, the first output-terminal, the first input-terminal and the first electrode to be at the voltage of the excitation signal.

The feedback-loop of the operational amplifier comprises the second mode selection-switch-unit and the reference resistor. The second input-terminal is connected to the inverting input of the operational amplifier without being part of the feedback-loop. Assuming idealized components, the measurement principle can be explained as follows:

Because of the presence of the feedback-loop, the inverting input forms a virtual ground. Therefore, as in the I-source case, the second electrode connected to the second input-terminal is at the potential of the common ground. The voltage at the first output-terminal is the same as the voltage at the first electrode. Consequently, in this situation, the voltage at the first output-terminal relative to the common ground equals the voltage across the sample.

As there is no current flowing into the inputs of the operational amplifier in this situation, the current flowing through the sample caused by the excitation signal, equals the current flowing through the reference resistor. As in the I-source case, the second resistor terminal of the reference resistor is at the common ground potential because of its connection to the virtual ground. The voltage measured at the second output-terminal relative to the common ground is again proportional to the current flowing through the sample.

Consequently, the voltage at the first output-terminal is a measure for the voltage across the sample and the voltage at the second output-terminal is a measure for the current through the sample. The impedance of the sample can therefore be determined using the two measurements signals obtainable at the first and the second output-terminal. Preferably, the impedance of the sample is determined by dividing the voltages at the first and the second output-terminal In an embodiment, the front-end circuit comprises an electrostatic discharge (ESD) protection device on any one of the input-terminals to a given threshold. Preferably, the ESD protection device is a pair of diodes, whereby the diodes are arranged in reverse direction, one being biased with a positive voltage of the positive given threshold and a second one being biased with a negative given threshold. The ESD protection devices of this embodiment are arranged between the first input-terminal and the first output-terminal and between the second input-terminal and the front-end-feedback-node, which is located at the connection between the reference resistor and the inverting input of the operational amplifier.

Such an ESD protection device protects the circuit from unexpected currents caused for example by an electrostatic discharge of a user touching the electrodes. Further, if the threshold can be adapted, it allows discharging the electrodes in a controlled manner at the end of a measurement by decreasing the biasing voltage.

In a further embodiment, the front-end circuit comprises filters to avoid the emission and reception of undesired electromagnetic fields. Preferably, the filters comprise an inductor arranged between the first input-terminal and the first-input-node. The first-input-node is a node connected to the first input-terminal, the first mode selection-switch-unit and the first output-terminal. Preferably, the filters comprise an inductor arranged between the second input-terminal and the front-end-feedback-node. The front-end-feedback-node is a node connected to the second input-terminal, the reference resistor and the inverting input of the operational amplifier. Preferably, the filters comprise a capacitor arranged between the first-input-node and the front-end-feedback-node. Preferably, the filters comprise a capacitor arranged between the first-input-node and the common ground.

Such filters allow to limit the emission of electromagnetic fields below predefined thresholds which allows to use the front-end circuit in close proximity to devices with are sensitive to such emissions. Furthermore, such filters allow limiting the reception of electromagnetic emissions, which allows using the front-end circuit in close proximity to devices generating such emissions.

A measurement circuit according to the invention comprises the front-end circuit and an analogue to digital converter device. The analogue to digital converter device is connected to the first and the second output-terminal. The analogue to digital converter device is suitable to convert analogue signals provided at the first and the second output-terminal simultaneously in digital signals.

The signal provided at the first output-terminal is a measurement of the voltage between the input-terminals during use of the front-end circuit. The signal provided at the second output-terminal is a measurement of the current flowing between the input-terminals in the same situation. Therefore, a simultaneous conversion of the two signals allows determining an instantaneous magnitude of the impedance without the need of interpolation or time stamps.

In an embodiment, the analogue to digital converter device is a two channel analogue to digital converter. This has the advantage of being compact and ensuring the simultaneous conversion. In another embodiment, the analogue to digital converter device is a set of two single channel analogue to digital converters.

Preferably, the two channel analogue to digital converter device is a delta-sigma converter or a successive-approximation converter.

A measurement circuit according to the invention comprises the front-end circuit and an excitation signal generator. The excitation signal generator is connected to the excitation-terminal of the front-end circuit. The excitation signal generator is suitable to provide an excitation signal with a desired waveform.

Preferably, the excitation signal generator comprises a digital to analogue converter (DAC), which is suitable to convert a digital signal describing the desired waveform in an analogue signal. This gives the user a wide flexibility in the choice of the excitation signals. In one embodiment, the analogue signal has the desired waveform. In another embodiment, the analogue signal is converted by further, predefined steps, to become the desired waveform.

Preferably, the excitation signal generator comprises in addition a second operational amplifier. In this embodiment, the output of the DAC is connected to the non-inverting input of a second operational amplifier. Preferably, the second operational amplifier is part of a unipolar to bipolar converter. Preferably, the inverting input of the second operational amplifier is connected to a signal-generator-feedback-node, which is located on the connection between an offset voltage source and the Op-Amp output of the second operational amplifier. A first gain-setting resistor is arranged between the Op-Amp output of the second operational amplifier and the signal-generator-feedback-node. A second gain-setting resistor is arranged between the offset voltage source and the signal-generator-feedback-node.

The excitation-terminal of the front-end circuit is connected to the signal-generator-output-node. The signal-generator-output-node is on the connection line between the Op-Amp output of the second operational amplifier and the signal-generator-feedback-node and arranged between the Op-Amp output of the second operational amplifier and the first gain-setting resistor. Particularly preferably, the offset voltage source provides a voltage equal to the reference voltage of the DAC and the first and the second gain-setting resistors are of equal resistance. In an embodiment, stabilizing elements, for example an arrangement of a resistor and a capacitor, can be part of the excitation signal generator. Such elements stabilize the output provided at the signal-generator-output-node.

This design of an excitation signal generator allows creating excitation signals with a predefined offset voltage. The excitation signals may have reversible polarity, if desired by the user. Further, the amplitude of the signals can be amplified compared to the output amplitude of the DAC.

In an embodiment, the measurement circuit according to the invention comprises any of the described embodiments of an excitation signal generator, preferably the disclosed combination of the DAC and the second operational amplifier, as well as any of the described embodiments of analogue to digital converter devices.

This embodiment includes the entire analogue signal transmission to be combined in the measurement circuit. The user only needs to read out the digital measurement results, provide signals representing the desired waveform of the excitation signal and provide power to the measurement circuit. As all transmitted signals are digital signals, the requirements for quality of the transmission are reduced.

In an embodiment, the analogue to digital converter device is connected to the excitation signal generator or to a controller of the excitation signal generator. As, depending on the mode chosen for an impedance measurement, the signal provided at either the first or the second output-terminal is proportional to the excitation signal created by the excitation signal generator, this connection allows a closed-loop control of the excitation signal created by the excitation signal generator.

In an embodiment, the measurement circuit comprises a microcontroller. The microcontroller is connected to the output of the analogue to digital converter device such that it can receive the digital signals during a measurement. The digital signals are generated by the analogue to digital converter device. In this case, the microcontroller can be used to evaluate the measurement result, for example, a magnitude of the impedance and a phase shift.

Further, the microcontroller can transmit a control signal to the first and the second mode selection-switch-unit to control the state of the mode selection-switch-units with a suitable control signal during the use of the measurement circuit. In embodiments where both mode selection-switch-units are combined in a single switch, such as in the case of a double-pole double-throw analogue switch or in the case of a multiple-pole double-throw analogue switch, the microcontroller can be connected to this single switch to thereby transmit the control signal to the two mode selection-switch-units. In embodiments where both mode selection-switch-units are realised by two separate switches, such as in the case of a pair of single-pole double-throw analogue switches, the microcontroller can be connected to both switches and can thereby transmit the control signal to the two mode selection-switch-units.

Further, in an embodiment, the measurement circuit comprises the excitation signal generator, which is connected to the microcontroller. In this case, the microcontroller sends instructions describing the desired waveform to the excitation signal generator during the use of the measurement circuit. Preferably, the instructions are given in the form of a digital input signal representing the desired waveform digitally.

In an embodiment, the microcontroller acts as a controller of a closed loop control by adapting the instructions regarding the desired waveform based on a detected difference between at least one of the digital signals received from the analogue to digital converter device and the desired waveform.

The outputs of further sensors, for example a temperature sensor, can be connected to the microcontroller. In this way, the microcontroller can use the signals produced by such further sensors for example in calibration procedures, for statistical analysis or for synchronous measurements of different quantities.

The use of the microcontroller facilitates the use of the measurement circuit for the user. Further, the microcontroller, especially if it comprises additional memory, can lower the requirements on the signal transmission to and from the measurement circuit, as the measurement results and the desired waveform can be transmitted and received with a time delay.

Preferably, the microcontroller is connected to a data interface. The data interface can be a first part of a socket-plug system, whereby the second part of the socket-plug system is connected to an instrument. Preferably, the socket-plug system is a digital signal and power transfer socket-plug system. The data interface can be a wireless data transmission system. The microcontroller can be equipped with a program code which tries to establish a communication link with the instrument via the data interface once a connection is detected, for example as soon as the microcontroller receives power. The microcontroller can be equipped to transmit data about its identity, its status and its history. The microcontroller can be equipped to receive data indicating the type of the instrument. Depending on the detected type of the instrument, the microcontroller can adapt the format and the type of the transmitted data, for example by adapting the data rate accordingly.

In an embodiment, the measurement circuit comprises a memory, preferably a non-volatile memory, most preferably an electrically erasable programmable read-only memory (EEPROM). The memory can comprise data about the impedance sensor of which the measurement circuit is part of, such as the type of the impedance sensor, possible further sensors, its calibration history, its estimated lifetime and selected measurement results. In an embodiment, the measurement circuit comprises a volatile memory. Such a volatile or non-volatile memory can be used to record a set of recent measurements for example as back-up in the case of a delay or fault in the data transmission or to allow a statistical analysis or a calibration of the recent measurements by the microcontroller.

In an embodiment, the measurement circuit comprises a crystal oscillator. A crystal oscillator can be used instead of or in addition to an internal oscillator of the microprocessor, to reduce the jitter, if needed, for example, to produce a highly accurate excitation signal.

A printed circuit board (PCB) can comprise the front-end circuit according to the invention and preferably the measurement circuit. In an embodiment, the front-end circuit is arranged on and thereby part of a single PCB. In a further embodiment, the measurement circuit is arranged on and thereby part of a single PCB.

This allows a compact arrangement, reduces the mechanical stress on the connections between the different components of the respective circuit. Further, it facilitates the installation.

In an embodiment, the PCB comprising the measurement circuit has an area of less than 530 mm$^2$. Preferably, its width is less or equal than 12 mm. Preferably, the thickness of the PCB is 1 mm. With these dimensions, an impedance sensor comprising the PCB is particularly compact.

An impedance sensor comprises the front-end circuit, preferably the measurement circuit, and two electrodes. One of the two electrodes is connected to the first input-terminal. The other one of the two electrodes is connected to the second input-terminal. Preferably, the impedance sensor comprises the PCB according to the invention.

This impedance sensor allows to measure the impedance of a sample in contact with the two electrodes in the V-source mode and in the I-source mode.

In an embodiment, the electrodes are platinum pins connected with wires to the first respectively second input-terminal.

In an embodiment of the impedance sensor the front-end circuit, preferably the measurement circuit, is arranged in a sensor head. The two electrodes are arranged in a sensor body. The sensor head is mounted to the sensor body.

In this arrangement, the distance between electrodes and the front-end circuit is minimized which increases the reliability of the measurement. As an impedance sensor, comprising the sensor head and the sensor body, is rigid compared to a cable, which connects an impedance sensor with an instrument, the mechanical stress on the connection wires between electrodes and the front-end circuit are reduced.

In the embodiment of the entire measurement circuit being arranged in the sensor head, the advantage of reduced mechanical stress applies to further connection wires between the different parts of the measurement circuit.

Due to the small number of components of the front-end circuit, the impedance sensor comprising the measurement circuit, the analogue to digital converter device, the excitation signal generator, the microcontroller and preferably even a memory, can be compact and of a size comparable to prior art impedance sensors.

In an embodiment, the sensor head and the sensor body are mounted to each other by the use of an analogue signal transfer socket-plug system. In this case, the first and the second input-terminal are formed to be or connected to contacts in a first part of the analogue signal transfer socket-plug system. Further, the electrodes of this embodiment are formed to be or connected to contacts in a second part of the analogue signal transfer socket-plug system.

This embodiment allows the replacement of the electrodes, reducing cost, facilitating the repair and saving resources.

In an embodiment, the sensor head comprises a first part of a digital signal and power transfer socket-plug system, which allows transferring power and measurement instructions to the impedance sensor and measurement results to an external receiver. Preferably, the measurement instructions to the impedance sensor and measurement result are transmitted as digital signals. Preferably, the first part of the digital signal and power transfer socket-plug system comprises four contacts. Preferably, two of out of the four are equipped for power transfer and two are preferably equipped for, preferably digital, data transmission. Preferably, the first part of the digital signal and power transfer socket-plug system comprises a fifth contact, which is used for a shielding.

The use of a digital signal and power transfer socket-plug system facilitates an exchange of the impedance sensor. The use of a cable connected by digital signal and power transfer socket-plug system allows an efficient power transfer. Allowing the disconnection of the cable from the impedance sensor gives the user flexibility in the choice of the cable lengths, reduces the storage needed for the impedance sensors and allows using a single cable for different sensors, impedance sensors and further compatible sensors, subsequently. The use of a wireless transmitter connected by digital signal and power transfer socket-plug system to the sensor head reduces the number of cables and can easily be removed, for example, to be recharged.

The external receiver may be a data evaluation unit of an instrument, which is part of a titration system or another analytical measurement system. The external receiver may be a personal computer or a storage device. The external receiver can be a display or a printer An instrument comprises an impedance sensor according to the invention, a power supply and a data interface. The power supply is connected or is suitable to be connected to the impedance sensor to provide power to the impedance sensor. The data interface is connected or is suitable to be connected to the impedance sensor to transmit and to receive signals to and from the impedance sensor. Preferably, the instrument comprises the second part of a digital signal and power transfer socket-plug system in the form of a socket as data interface and to transmit power from the power supply to the impedance sensor.

In an embodiment, the instrument is part of a titration system, whereby the instrument comprises a data evaluation unit, which receives the measurement values from the impedance sensor during the measurement and which is equipped to issue control signals in response to an observed difference between the received measurement values and a setpoint value. During the measurement, the control signals cause a controlled addition of a reagent to a sample.

Preferably, the impedance sensor is used in a titration process. Particular preferably, the waveform of the excitation signal in either the V-source or the I-source mode has the form of a constant value or of a ramp with constantly increasing or decreasing amplitude, which is in some embodiments combined with a sine.

Preferably, in an I-source titration mode of a titration process with the impedance sensor, a curve showing the measured voltage across the sample in response to the amount of added reagent is determined. Thereby, the voltage across the sample is derived from the voltage measured at the first output-terminal and the sensor is used in the I-source mode. Particularly preferably, the voltage measured at the second output-terminal is monitored to ensure that the measurement takes place while the desired current flows through the sample.

Preferably, in a V-source titration mode of a titration process with the impedance sensor, a curve showing the current through the sample in response to the amount of added reagent is determined. Thereby, the current through the sample is derived from the voltage measured at the second output-terminal and the sensor is used in the V-source mode. Particularly preferably, the voltage measured at the first output-terminal is monitored to ensure that the measurement takes place while the desired voltage is applied to the sample.

Preferably, in an impedance titration mode of a titration process with the impedance sensor, at least one curve showing one of the parameters, which describe the impedance of the sample in response to the amount of added reagent, is determined. Particularly preferably, two or more curves showing different parameters, which describe the impedance of the sample in response to the amount of added reagent, are determined. At least one parameter, which describes the impedance, is derived from the voltage measured at the first output-terminal and the voltage measured at the second output-terminal. In one embodiment, the sensor is used in the I-source mode, where the current flowing through the sample is controlled and the voltage across the sample is measured, or in the V-source mode, where the voltage across the sample is controlled and the current through the sample is measured.

Particular preferably, in an impedance titration mode of a titration process with the impedance sensor, a curve showing the current through the sample in response to a varying voltage across the sample at a constant amount of reagent is determined. In this embodiment, the sensor is used in the V-source mode and the waveform of the excitation signal has the form of a ramp with constantly increasing or decreasing amplitude, which is in some embodiments combined with a sine.

Particular preferably, in an impedance titration mode of a titration process with the impedance sensor, a curve showing the voltage across the sample in response to a current through the sample at a constant amount of reagent is determined. In this embodiment, the sensor is used in the I-source mode and the waveform of the excitation signal has the form of ramp with constantly increasing or decreasing amplitude, which is in some embodiments combined with a sine.

Particular preferably, in an impedance titration mode of a titration process with the impedance sensor, a curve showing at least one of the parameters, which describe the impedance of the sample in response to a voltage with varying frequency across the sample at a constant amount of reagent, is determined. In this embodiment, the sensor is used in the V-source mode and the waveform of the excitation signal has preferably the form of a constant, combined with a sine of changing frequency.

Particular preferably, in an impedance titration mode of a titration process with the impedance sensor, a curve showing at least one of the parameters, which describe the impedance of the sample in response to current with varying frequency through the sample at a constant amount of reagent, is determined. In this embodiment, the sensor is used in the I-source mode and the waveform of the excitation signal has preferably the form of a constant, combined with a sine of changing frequency.

Determining the impedance, the voltage or the current as a function of different excitation signals at a constant amount of reagent increases the knowledge of the electrical properties of the sample. The results may be used to determine which property is particular sensible for changes to be detected in the sample at hand and therefore to decide which titration mode to use in further titrations of similar samples.

Preferably, the impedance sensor is used for electro-chemical impedance spectroscopy.

Preferably, the waveform of the excitation signal has the form of a single frequency sine wave, a multiple frequency sine wave, a chirp-signal, a square wave, a pseudo random noise signal, a constant or slowly increasing or decreasing DC signal. In a further embodiment, the waveform is an offset DC signal combined with a sine with an amplitude smaller that this offset.

Preferably, the impedance sensor is used to measure the resistance of a sample. Particular preferably, the excitation signal in either the V-source or the I-source mode has the form of a single, constant value, a ramp with a slowly and constantly increasing or decreasing amplitude or a set of steps of different, constant values. Due to the DC characteristic of the excitation signal, the ratio of the measurement signals provided at the first and the second output-terminals is a measure for the resistance of sample.

Preferably, the impedance sensor is used to measure the magnitude and the phase shift describing the impedance of a sample at the frequency of the excitation signal. Particular preferably, the excitation signal in either the V-source or the I-source mode has a waveform in the form of a single, constant frequency sine or a set of constant frequency sines or a multiple frequency sine. Due to the sine waveform of the excitation signal and the simultaneous detection of the measurement signals provided at the first and the second output-terminals, the phase shift can be easily detected, for example by detecting the maximum values and/or zero crossings of both measurement signals while the ratio of the measurement signals indicates the magnitude of the impedance. Another way to extract the impedance is to express the times series measured at the first and at the second output terminal as complex functions and to divide them. To derive the complex functions from the measured time series, a Fourier transformation, such as the FFT-algorithm, can be applied to derive the frequencies occurring in the measurements.

DESCRIPTION OF EMBODIMENTS

Figures 1, 2, 3:
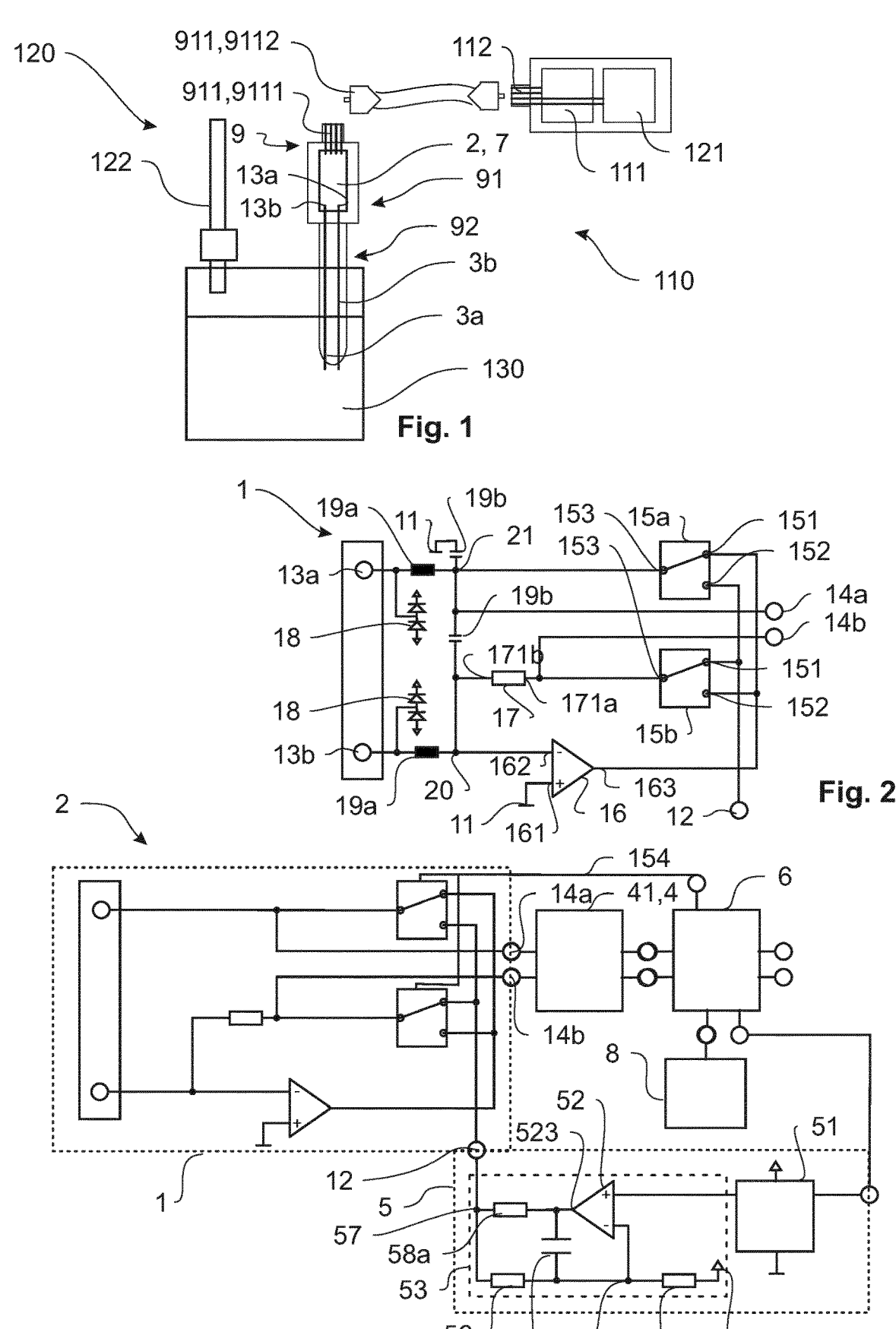
FIG. 1A titration system comprising an instrument with an impedance sensor
FIG. 2A front-end circuit
FIG. 3A measurement circuit, comprising a front-end circuit, an excitation signal generator, an analogue to digital converter device, a microcontroller and a memory
FIG. 4*a* The front-end circuit used in the I-source mode
FIG. 4*b* The front-end circuit used in the V-source mode

FIG. 1 shows a titration system 120, which comprises an instrument 110 with an impedance sensor 9. The titration system 120 issues control signals to a controllable burette 122, which adds a controlled amount of a reagent to the sample 130 accordingly. The control signals are issued by the data evaluation unit 121, which is part of the titration system 120. The data evaluation unit 121 issues the control signals in response to measurement values. The measurement values are generated by the impedance sensor 9, which is a part of the instrument 110.

The instrument 110 comprises in addition to the impedance sensor 9 a power supply 111 and a data interface 112. In the embodiment shown in FIG. 1, the power supply 111 is suitable to be connected to the impedance sensor 9 and the data interface 112 is suitable to be connected to the impedance sensor 9. Both connections can be established by a digital signal and power transfer socket-plug system 911. In the embodiments shown in FIG. 1, both, the impedance sensor 9 and an instrument housing comprising the power supply 111 and the data evaluation unit 121 comprise a first part of the digital signal and power transfer socket-plug system 9111. A cable comprising a second part of the digital signal and power transfer socket-plug system 9112 at both of its ends is provided to enable the connection for power and signal transmission. Both parts of the digital signal and power transfer socket-plug system 911 comprises four contacts. Two of the four contacts are intended to transfer power and are therefore, in the case of the first part of a digital signal and power transfer socket-plug system mounted to the instrument housing, connected with the power supply 111. The other two contacts are intended to transfer data signals and are therefore, in the case of the first part of a digital signal and power transfer socket-plug system mounted to the instrument housing, connected to the data evaluation unit 121. At the impedance sensor 9, all four contacts are connected to the printed circuit board (PCB) 7.

The impedance sensor 9 comprises a sensor head 91 and a sensor body 92. The printed circuit board (PCB) 7, carrying the measurement circuit 2, is arranged inside the sensor head 91. In order to be able to show the PCB 7, the sensor head 91 is shown to be transparent. The measurement circuit 2 arranged on the PCB 7 will be described in more detail in the further Figures. The measurement circuit 2 comprises a first and a second input-terminal 13a,b, and two electrodes 3a,b, are connected to these input-terminals. The electrodes 3a,b, run in parallel through the sensor body 92. The sensor body 92 or insulations surrounding the electrodes over most of their lengths can be used to ensure that the electrodes do not touch each other. The tips of both electrodes 3a,b, are in contact with the sample 130. Thereby, the sample 130 closes an electric circuit formed by the electrodes 3a,b and the measurement circuit 2. This allows measuring the resistance or the impedance of the sample 130.

FIG. 2 shows the front-end circuit 1 in detail: The front-end circuit 1 comprises the excitation-terminal (12), the first and a second input-terminal (13a,b), where the two electrodes (3a,b) can be connected, a first and a second output-terminal (14a,b), a first and a second mode selection-switch-unit (15a,b), an operational amplifier (16) and a reference resistor (17). In this in the further illustrated embodiments, the first and the second mode selection-switch-units (15a,b) are shown, as example only, as single-pole double-throw analogue switches. In all cases, the first and the second mode selection-switch-units could be realized as channels of a double- or a multiple-pole double-throw analogue switch.

In addition, the front-end circuit 1 according to the embodiment shown in FIG. 2 comprises ESD protection devices (18), in the form of pairs of diodes and filters in the form of inductors (19a) and capacitors (19b) to avoid the emission and reception of undesired electromagnetic fields.

Any of the two mode selection-switch-units (15a, 15b) comprises a first mode switch-input (151), a second mode switch-input (152) and a switch-output (153). It depends on the state of the mode selection-switch-units (15a, 15b), if the first mode switch-input (151) or the second mode switch-input (152) is connected to the switch-output (153).

The operational amplifier (16) comprises a non-inverting input (161), an inverting input (162) and an Op-Amp output (163).

The reference resistor (17) comprises a first and a second resistor terminal (171a,b).

These elements are arranged as follows: The non-inverting input (161) of the operational amplifier (16) is connected to the common ground (11). The Op-Amp output (163) is connected to the first mode switch-input (151) of the first mode selection-switch-unit (15a) and the second mode switch-input (152) of the second mode selection-switch-unit (15b). The excitation-terminal (12) is connected to the second mode switch-input (152) of the first mode selection-switch-unit (15a) and the first mode switch-input (151) of the second mode selection-switch-unit (15b).

The switch-output (153) of the first mode selection-switch-unit (15a) is connected to the first input-terminal (13a) and the first output-terminal (14a). In the shown embodiment, one of the inductors (19a), which is used as filter, is arranged between the first output-terminal (14a) and the first input-terminal (13a).

In addition, a diode arrangement as an ESD protection device (18) is connected between the first input-terminal (13a) and the inductor (19a). The diode arrangement is a pair of diodes. The diodes are arranged in reverse direction. The one diode is being biased with a positive voltage of the given threshold, for example 2V. The second diode is biased with a negative voltage of the amplitude of the threshold, for example −2V. In this embodiment, if the absolute value of the voltage at the first input-terminal is greater than the sum of the threshold and the diode forward voltage drop, one of the two diodes conducts the resulting current. Therefore, the voltage at the first input-terminal (13a) is limited to the sum of the threshold and the diode forward voltage drop.

Two capacitors (19b), which are used as filters, are connected to a first-input-node (21). The first-input-node (21) is located between the switch-output (153) of the first mode selection-switch-unit (15a), the first output-terminal (14a) and the inductor (19a) connected to the first input-terminal (13a). One of the two capacitors (19b) is further connected to the common ground (11). The other one of the two capacitors (19b) is further connected to the second resistor terminal (171b) of the reference resistor (17) respectively the front-end-feedback-node (20).

The switch-output (153) of the second mode selection-switch-unit (15b) is connected to the first resistor terminal (171a) of the reference resistor (17), and the second output-terminal (14b).

The second resistor terminal (171b) of the reference resistor (17) is connected to the inverting input (162) of the operational amplifier (16) and to the second input-terminal (13b) at the front-end-feedback-node (20). In the shown embodiment, one of the inductors (19a) is arranged between the second input-terminal (13b) and the front-end-feedback-node (20).

In addition and as described above, a diode arrangement as ESD protection device (18) is connected between the second input-terminal (13b) and the inductor (19a).

As already described above, one of the two capacitors (19b) is arranged between the first-input-node (21) and the front-end-feedback-node (20).

In some embodiments, the front-end circuit (1) may comprise further resistors, arranged for example in the first and second output-terminal (14a, 14b) and/or at the switch-output (153) of the first mode selection-switch-unit (15a) and/or at the inverting input (162) of the operational amplifier (16). In further embodiments, a capacitor is arranged in parallel to the operational amplifier (16), between its inverting input (162) and the Op-Amp output (163). Resistors arranged in the output-terminals (14a, 14b) allow adapt the expected signals to the requirements of the devices intended to receive the signals. Resistors at the switch-output (153) of the first mode selection-switch-unit (15a) and/or at the inverting input (162) of the operational amplifier (16) as well as the optional additional capacitor can increase the stability of the front-end circuit (1) and assist or be part of the ESD protection device (18).

FIG. 3 discloses a measurement circuit (2) with a front-end circuit (1), an excitation signal generator (5), an analogue to digital converter device (4), a microcontroller (6) and a memory (8).

The front-end circuit (1) of FIG. 3 is shown in a simplified embodiment, compared to the one depicted in FIG. 2. It comprises the excitation-terminal (12), the first and a second input-terminal (13a,b), the first and a second output-terminal (14a,b), the first and a second mode selection-switch-units (15a,b), the operational amplifier (16) and a reference resistor (17). The non-inverting input of the operational amplifier (16) is connected to the common ground 11. The Op-Amp output is connected to the first mode switch-input of the first mode selection-switch-unit (15a) and the second mode switch-input of the second mode selection-switch-unit (15b). The excitation-terminal (12) is connected to the second mode switch-input of the first mode selection-switch-unit (15a) and the first mode switch-input of the second mode selection-switch-unit (15b). The switch-output of the first mode selection-switch-unit (15a) is connected to the first input-terminal (13a) and the first output-terminal (14a). The switch-output of the second mode selection-switch-unit (15b) is connected to the first resistor terminal of the reference resistor (17) and the second output-terminal (14b). The second resistor terminal of the reference resistor (17) is connected to the inverting input of the operational amplifier and to the second input-terminal (13b).

In the embodiment of FIG. 3, the excitation signal generator (5) is connected to the excitation-terminal (12) of the front-end circuit (1). The excitation signal generator (5) comprises a digital to analogue converter (51) which can receive an input signal representing the excitation signal. In the depicted embodiment, the digital to analogue converter (51) is connected to a microcontroller 6, which provides the digital signal representing the desired waveform during use of the measurement circuit 2. The digital to analogue converter (51) is suitable to convert this digital signal in an analogue output signal. In some embodiments, this output signal may be delivered as excitation signal to the excitation-terminal (12) without further modification and in these embodiments, the output of the digital to analogue converter (51) is directly connected to the excitation-terminal (12).

In the embodiment of FIG. 3, the excitation signal generator (5) comprises a unipolar to bipolar converter (53). The analogue output of the digital to analogue converter (51) is connected to the input of the unipolar to bipolar converter (53). The unipolar to bipolar converter (53) comprises a second operational amplifier (52), two gain-setting resistors (56) and an offset voltage source (55). In addition, the excitation signal generator (5) as shown in FIG. 3 shows optional stabilizing elements (58a,b) in the form of a resistor (58a) and a capacitor (58b) which stabilize the signal provided at the signal-generator-output-node (57) in the case of complex loads.

The output of the digital to analogue converter (51) is connected to the non-inverting input of the second operational amplifier (52). The inverting input of the second operational amplifier (52) is connected to a signal-generator-feedback-node (54). The signal-generator-feedback-node (54) is connected to the offset voltage source (55) and the Op-Amp output (523) of the second operational amplifier (52). The first gain-setting resistor (56) is arranged in the connection line between the Op-Amp output (523) of the second operational amplifier (52) and the signal-generator-feedback-node (54). The second gain-setting resistors (56) is arranged in the connection line between the offset voltage source (55) and the signal-generator-feedback-node (54). The excitation-terminal (12) of the front-end circuit (1) is connected to a signal-generator-output-node (57). The signal-generator-output-node (57) is on the connection line between the Op-Amp output (523) of the second operational amplifier (52) and the signal-generator-feedback-node (54). The signal-generator-output-node (57) is arranged between then the Op-Amp output (523) of the second operational amplifier (52) and the first gain-setting resistor (56). If there are stabilizing elements (58a,b), the resistor (58a) is arranged between the Op-Amp output (523) of the second operational amplifier (52) and the signal-generator-output-node (57) and the capacitor (58b) is arranged in parallel to the resistor (58a), the signal-generator-output-node (57) and the first gain-setting resistors (56).

In this way, the second operational amplifier (52) acts with respect to the analogue output of the digital to analogue converter (51) as non-inverting amplifier and with respect to the offset voltage source (55) as inverting amplifier. Regarding the operational amplifier output, both portions are summed. In the preferred embodiment, both gain-setting resistors have the same resistance and the offset voltage source (55) provides a positive voltage equal to the maximum voltage provided at the DAC-output. In this case, the result of the summing provided by the second operational amplifier (52) is a bipolar voltage covering a range between the inverted offset voltage and the maximum DAC-output voltage.

The measurement circuit (2) of FIG. 3 shows further an analogue to digital converter device (4). The analogue to digital converter device (4) is a two-channel analogue to digital converter (41). The two input channels of the two-channel analogue to digital converter (41) are connected to the first and the second output-terminal (14a,b) of the front-end circuit (1). The two-channel analogue to digital converter (41) is suitable to convert both received analogue signals simultaneously into digital signals. The two-channel analogue to digital converter (41) comprises in the illustrated embodiment two ADC-output terminals. In further embodiments, the digital signals of both channels are transmitted by a single ADC-output terminal. The ADC-output terminals are, in the depicted embodiment, connected to the microcontroller (6). The two-channel analogue to digital convert (41) is preferably a delta-sigma converter.

In the embodiment according to FIG. 3, the microcontroller (6) is further connected to a memory (8). The memory (8) is for example an EEPROM or a Flash memory.

The microcontroller (6) comprises a terminal, which is connected to control terminals of the single-pole double-throw analogue switches by a control-signal line (154). The control-signal line (154) allows the microcontroller to transmit a control signal to the mode selection-switch-units. The single-pole double-throw analogue switches form the mode selection-switch-units of the front-end circuit (1) in the illustrated embodiment. By sending a suitable control signal to the mode selection-switches, the microcontroller (6) can change the state of the two mode selection-switch-units simultaneously. Thereby, the measurement mode, either the I-source or the V-source mode, can be chosen. In another embodiment, the two mode-selection-switch units of the front-end circuit (1) are part of a single switch such as a double- or multiple-pole double-throw analogue switch, which may have only a single control terminal connected to the microcontroller to receive a control signal, which can change the state of the two mode selection-switch-units simultaneously.

The microcontroller (6) comprises communication terminals to communicate with a user interface or an instrument (110), for example with a data evaluation unit (121) as depicted in FIG. 1.

Figure 4A:
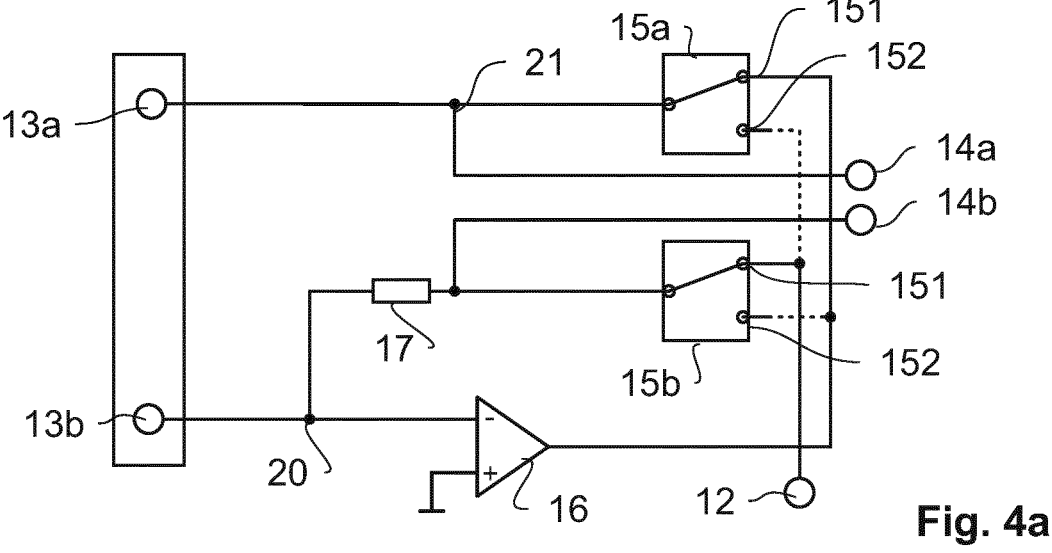
Figure 4B:
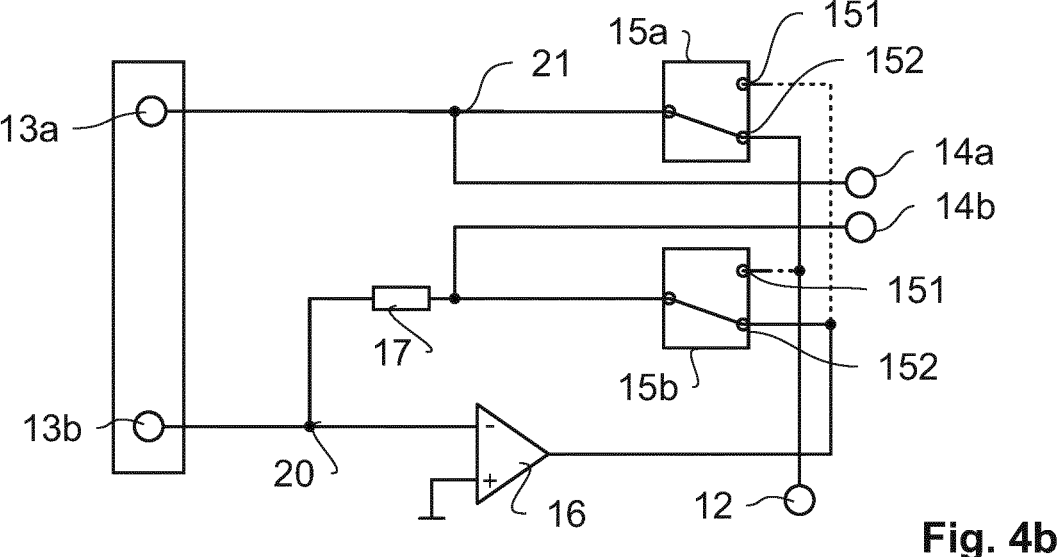

FIG. 4*a* depicts the use of the front-end circuit (1) in the I-source mode and FIG. 4*b* in the V-source mode. Both Figures show the simplified embodiment of the front-end circuit (1), which was already shown in FIG. 3. In FIGS. 4*a* and 4*b*, connections through which no current can flow due to the state of the mode selection-switch-units 15*a*, 15*b* are shown as dashed lines.

In FIG. 4*a*, both, the first and the second mode selection-switch-units 15*a*, 15*b* are in a state where the first mode switch-input 151 is connected to the respective switch-output 153. In this situation, the excitation-terminal 12 is connected to the output of the second mode selection-switch-unit 15*b* and the voltage applied to the excitation-terminal 12 can be detected at the second output-terminal 14*b*.

During a measurement, the feedback-loop of the operational amplifier 16, which connects the Op-Amp output with the inverting input comprises the first mode selection-switch-unit 15*a* and the input-terminals 13*a*, 13*b*. The loop is closed by the first and the second electrode, which are during use connected to the respective input-terminals 13*a*, 13*b* and the sample 130 to be measured.

It is a known property of an operational amplifier 16 with such a feedback-loop that it generates such a current at its output that both of its inputs are at the same potential and that there is no current flowing into any of the inputs.

The voltage applied to the excitation-terminal 12 is, after being attenuated by the reference resistor 17, applied to the inverting input of the operational amplifier 16. According to the properties of the operational amplifier 16, the operational amplifier 16 reacts by generating a counter balancing current, which flows through the sample 130 with the unknown impedance. The current is obviously the same as the one flowing through the reference resistor 17, as no current enters the inverting input of the idealized operational amplifier 16.

The potential at the inverting input of the operational amplifier 16, the second resistor terminal 171*b* and the second input-terminal 13*b* is the same as the common ground 11 applied to the non-inverting input of the operational amplifier 16. The voltage, relative to the common ground 11, at the first output-terminal 14*a* is therefore a measure for the potential difference across the sample 130. The voltage, relative to the common ground 11, at the second output-terminal 14*b* is, together with the known resistance of the reference resistor 17, a measure for the current flowing through the sample 130, which is generated by the operational amplifier 16 in reaction to the excitation signal applied to the excitation-terminal 12.

In this measurement mode, the I-source mode, it is the current through the sample 130, which is controlled by the excitation signal. The current through the sample 130, which is the controlled parameter of the I-source mode, can be observed at the second output-terminal 14*b*. The voltage across the sample 130, which is the measured parameter of the I-source mode, can be observed at the first output-terminal 14*a*.

In FIG. 4*b*, both, the first and the second mode selection-switch-unit 15*a*, 15*b* are in a state where the second mode switch-input 152 is connected to the respective switch-output 153. In this situation, the excitation-terminal 12 is connected to the output of the first mode selection-switch-unit 15*a* and the voltage applied to the excitation-terminal 12 can be detected at the first output-terminal 14*a*.

The feedback-loop of the operational amplifier 16, which connects the Op-Amp output with the inverting input comprises the second mode selection-switch-unit 15*b*, and the reference resistor 17. The voltage applied to the excitation-terminal 12 is, during a measurement, applied to the sample 130 arranged between first and second electrodes, which are connected to the respective input-terminals 13*a*, 13*b*.

It is a known property of an operational amplifier 16 with such a feedback-loop that it generates such a current at its output that both of its inputs are at the same potential and that there is no current flowing into any of the inputs.

Therefore, the potential at the inverting input of the operational amplifier 16, the second resistor terminal 171*b* and the second input-terminal 13*b* is the same as the common ground 11 applied to the non-inverting input of the operational amplifier 16. Accordingly, there is a potential difference across the sample 130, following the voltage applied to the excitation-terminal 12.

The current caused by this potential difference is, according to the properties of the operational amplifier 16, conducted through the feedback-loop of the operational amplifier 16. Therefore, the current flows through the reference resistor 17.

The voltage, relative to the common ground 11, at the first output-terminal 14*a* is therefore a measure for the potential difference across the sample 130, which is caused by the excitation signal applied to the excitation-terminal 12. The voltage, relative to the common ground 11, at the second output-terminal 14*b* is, together with the known resistance of the reference resistor 17, a measure for the resulting current flowing through the sample 130.

In this measurement mode, the V-source mode, it is the voltage applied to the sample 130, which is controlled by the excitation signal. The current through the sample 130, which is the measured parameter of the V-source mode, can be observed at the second output-terminal 14*b*. The voltage across the sample 130, which is the controlled parameter of the V-source mode, can be observed at the first output-terminal 14*a*.

| Reference signs list | |
|---|---|
| 1 | front-end circuit |
| 11 | Common ground |
| 12 | excitation-terminal |
| 13a, b | first and a second input-terminal |
| 14a, b, | first and a second output-terminal |
| 15a, b, | first and a second mode selection-switch-unit |
| 151 | first mode switch-input |
| 152 | second mode switch-input |
| 153 | switch-output |
| 154 | Control-signal line for mode selection |
| 16 | operational amplifier |
| 161 | non-inverting input |
| 162 | inverting input |
| 163 | Op-Amp output |
| 17 | reference resistor |
| 171a, b | first and a second resistor terminal |

-continued

| Reference signs list | |
|---|---|
| 18 | ESD protection device |
| 19a | Inductors (as filters to avoid the emission of undesired EM fields) |
| 19b | Capacitors (as filters to avoid the emission and reception of undesired EM fields) |
| 20 | Front-end-feedback-node |
| 21 | First-input-node |
| 2 | measurement circuit |
| 3a, b | Electrodes |
| 4 | analogue to digital converter device |
| 41 | two-channel analogue to digital converter |
| 5 | excitation signal generator |
| 51 | digital to analogue converter |
| 52 | a second operational amplifier |
| 523 | Op-Amp output of the second operational amplifier |
| 53 | an unipolar to bipolar converter |
| 54 | signal-generator-feedback-node |
| 55 | offset voltage source |
| 56 | gain-setting resistor |
| 57 | signal-generator-output-node |
| 58a, b | Stabilizing elements (a: resistor, b: capacitor) |
| 6 | Microcontroller |
| 7 | PCB |
| 8 | Memory |
| 9 | impedance sensor |
| 91 | Sensor head |
| 911 | digital signal and power transfer socket-plug system |
| 9111 | first part of a digital signal and power transfer socket-plug system |
| 9112 | second part of a digital signal and power transfer socket-plug system |
| 92 | Sensor body |
| 110 | Instrument |
| 111 | power supply |
| 112 | data interface |
| 120 | Titration system |
| 121 | data evaluation unit |
| 122 | Controllable burette |
| 130 | Sample |

The invention claimed is:

1. A front-end circuit for impedance measurement comprising:
   a. an excitation-terminal, intended to receive an excitation signal relative to a common ground;
   b. a first and a second input-terminal, intended to be connected to two electrodes;
   c. an operational amplifier comprising:
      i. a non-inverting input connected to the common ground,
      ii. an inverting input, and
      iii. an Op-Amp output;
   d. a switching unit, wherein a state of the switching unit determines an operation of the operational amplifier, and wherein the switching unit comprises a first and a second mode selection-switch-unit, wherein:
      i. the first mode selection-switch-unit comprises:
         1. A first mode switch-input connected to the Op-Amp output, and
         2. a second mode switch-input connected to the excitation-terminal,
      ii. the second mode selection-switch-unit comprises:
         1. the first mode switch-input connected to the excitation terminal, and
         2. the second mode switch-input connected to the Op-Amp output, and
      iii. each of the first and second mode selection-switch-unit comprises a switch-output, wherein a state of the mode selection-switch-unit determines whether the first mode switch-input or the second mode switch-input is connected to the switch-output,
   e. a first and a second output-terminal, wherein:
      i. the switch-output of the first mode selection-switch-unit is connected to the first input-terminal and the first output-terminal, and
      ii. the switch-output of the second mode selection-switch-unit is connected to a first resistor terminal of a reference resistor and the second output-terminal;
   f. the reference resistor comprising the first resistor terminal and a second resistor terminal, wherein the second resistor terminal of the reference resistor is connected to the inverting input of the operational amplifier and the second input-terminal;
   wherein, the front-end circuit is configured to, when in use such that electrodes are connected to the first and the second input terminal while a sample is arranged between the electrodes and while the excitation signal is received at the excitation-terminal:
      i. provide a measurement signal indicating the voltage across the sample at the first output-terminal,
      ii. provide a measurement signal indicating the current flowing through the sample at the second output-terminal, and
      iii. depending on the state of the switching unit, the excitation signal causes either a current flowing through the electrodes and the sample or a voltage across the electrodes and the sample.

2. A measurement circuit, comprising:
   the front-end circuit of claim 1; and
   an analogue to digital converter device connected to the first and the second output-terminal, wherein the analogue to digital converter device is suitable to convert analogue signals provided at the first and the second output-terminal simultaneously into digital signals.

3. The measurement circuit of claim 2, whereby the analogue to digital converter device is a two-channel analogue to digital converter.

4. The measurement circuit of claim 2 comprising:
   an excitation signal generator connected to the excitation-terminal, wherein the excitation signal generator is suitable to provide an excitation signal with a desired waveform.

5. The measurement circuit of claim 2 further comprising:
   a microcontroller, wherein said microcontroller:
      a. is connected to an output of the analogue to digital converter device to receive the digital signals during a measurement, and
      b. is capable of transmitting a control signal to the first and the second mode selection-switch-unit to control the state of the first and the second mode selection-switch-unit during use of the measurement circuit.

6. A measurement circuit, comprising:
   a. the front-end circuit of claim 1; and
   b. an excitation signal generator connected to the excitation-terminal, wherein the excitation signal generator is suitable to provide an excitation signal with a desired waveform.

7. The measurement circuit of claim 6, wherein:
   the excitation signal generator comprises a digital to analogue converter, which is suitable to convert a digital signal representing the desired waveform into an analogue signal.

8. The measurement circuit of claim 7 further comprising:
   a microcontroller, wherein said microcontroller:

a. is connected to an output of the analogue to digital converter device to receive the digital signals during a measurement, and b. is capable of transmitting a control signal to the first and the second mode selection-switch-unit to control the state of the first and the second mode selection-switch-unit during use of the measurement circuit and wherein the microcontroller is connected to the excitation signal generator to send instructions in the form of a digital signal representing the desired waveform during use of the measurement circuit.

9. A PCB comprising the front-end circuit of claim 1.

10. An impedance sensor comprising:

the front-end circuit of claim 1; and two electrodes, whereby one of the two electrodes is connected to the first input-terminal and the other of the two electrodes is connected to the second input-terminal.

11. The impedance sensor of claim 10, whereby the front-end circuit is arranged in a sensor head and the two electrodes are arranged in a sensor body and whereby the sensor head is mounted to the sensor body.

12. The impedance sensor of claim 11 whereby, the sensor head comprises a first part of a digital signal and power transfer socket-plug system, which allows transferring power and measurement instructions to the impedance sensor and measurement results to an external receiver.

13. An instrument comprising:

a. the impedance sensor of claim 10;

b. a power supply connected, or suitable to be connected, to the impedance sensor to provide power to the impedance sensor; and c. a data interface connected, or suitable to be connected, to the impedance sensor to transmit and to receive signals from respectively to the impedance sensor.

14. A titration system comprising:

the instrument of claim 13; and a data evaluation unit, which receives measurement values from the impedance sensor during a measurement and which is equipped to issue control signals which cause a controlled addition of a reagent to a sample in response to an observed difference between the received measurement values and a setpoint value during the measurement.

15. An impedance sensor comprising:

a PCB comprising the circuit of claim 1; and two electrodes, whereby one of the two electrodes is connected to the first input-terminal and the other of the two electrodes is connected to the second input-terminal.

16. An impedance sensor comprising:

a front-end circuit; and two electrodes, whereby one of the two electrodes is connected to the first input-terminal and the other of the two electrodes is connected to the second input-terminal and whereby the front-end circuit is arranged in a sensor head and the two electrodes are arranged in a sensor body and whereby the sensor head is mounted to the sensor body;

wherein the front-end circuit comprises:

a. an excitation-terminal, intended to receive an excitation signal relative to a common ground;

b. a first and a second input-terminal, intended to be connected to two electrodes;

c. an operational amplifier comprising:
   i. an inverting input; and
   ii. an Op-Amp output;

d. a switching unit, wherein a state of the switching unit determines an operation of the operational amplifier;

wherein the front-end circuit is configured to, when in use such that electrodes are connected to the first and the second input terminal while a sample is arranged between the electrodes and while the excitation signal is received at the excitation-terminal:

cause, by the excitation signal and depending on the state of the switching unit, one of:

1. A current flowing through the electrodes and the sample, and 2. a voltage across the electrodes and the sample.

17. A front-end circuit for impedance measurement comprising:

a. an excitation-terminal, intended to receive an excitation signal relative to a common ground;

b. a first and a second input-terminal, intended to be connected to two electrodes;

c. an operational amplifier comprising:
   i. a non-inverting input connected to the common ground,
   ii. an inverting input, and
   iii. an Op-Amp output;

d. a switching unit, wherein a state of the switching unit determines an operation of the operational amplifier, and wherein the switching unit comprises a first and a second mode selection-switch-unit, wherein:
   i. the first mode selection-switch-unit comprises:
      1. A first mode switch-input connected to the Op-Amp output, and
      2. a second mode switch-input connected to the excitation-terminal,
   ii. the second mode selection-switch-unit comprises:
      3. the first mode switch-input connected to the excitation terminal, and
      4. the second mode switch-input connected to the Op-Amp output, and
   iii. each of the first and second mode selection-switch-unit comprises a switch-output, wherein a state of the mode selection-switch-unit determines whether the first mode switch-input or the second mode switch-input is connected to the switch-output, e. a first and a second output-terminal, wherein:
   i. the switch-output of the first mode selection-switch-unit is connected to the first input-terminal and the first output-terminal, and
   ii. the switch-output of the second mode selection-switch-unit is connected to a first resistor terminal of a reference resistor and the second output-terminal; and f. the reference resistor comprising the first resistor terminal and a second resistor terminal, wherein the second resistor terminal of the reference resistor is connected to the inverting input of the operational amplifier and the second input-terminal.

* * * * *